United States Patent
Pillai

(10) Patent No.: US 7,710,798 B2
(45) Date of Patent: May 4, 2010

(54) STATE STORAGE WITH DEFINED RETENTION TIME

(75) Inventor: Vijay Pillai, Mukilteo, WA (US)

(73) Assignee: Intermec IP Corp., Everett, WA (US)

( * ) Notice: Subject to any disclaimer, the term of this patent is extended or adjusted under 35 U.S.C. 154(b) by 508 days.

(21) Appl. No.: 11/555,114

(22) Filed: Oct. 31, 2006

(65) Prior Publication Data

US 2008/0101106 A1    May 1, 2008

(51) Int. Cl.
*G11C 7/00*    (2006.01)

(52) U.S. Cl. .................... 365/192; 340/10.1

(58) Field of Classification Search ........... 340/2.1–2.8, 340/10.1–10.6, 10.51, 572.1–572.9; 700/215, 700/221, 225, 227; 365/192, 104; 455/150.1, 455/151.1; 235/375–385, 492; 726/20
See application file for complete search history.

(56) References Cited

U.S. PATENT DOCUMENTS

| | | | |
|---|---|---|---|
| 6,404,325 B1 | 6/2002 | Heinrich et al. | |
| 6,812,841 B2 | 11/2004 | Heinrich et al. | |
| 2002/0149482 A1* | 10/2002 | Shanks et al. | 340/572.1 |
| 2004/0066278 A1* | 4/2004 | Hughes et al. | 340/10.1 |
| 2006/0094380 A1* | 5/2006 | Slatter | 455/151.2 |
| 2006/0202804 A1 | 9/2006 | Vijay-Pillai et al. | |
| 2007/0046369 A1* | 3/2007 | Schober et al. | 330/7 |

OTHER PUBLICATIONS

Pillai, Vijay et al. "Using Volatile State Storage for Substantial Improvement in RFID Throughput,", Dec. 5, 2005.
EPC Global, "Specification for RFID Air Interface: EPC™ Radio-Frequency Identity Protocols Class-1 Generation-2 UHF RFID Protocol for Communications at 860 MHz—960 MHz Version 1.0.9" p. 1-94, Jan. 31, 2005.
Philips, Short Form Specification "UCODE HSL SL3ICS30 01" http://www.nxp.com/acrobat_download/other/identification/SFS069730.pdf, Oct. 2003, 9 pages.

* cited by examiner

*Primary Examiner*—Richard Elms
*Assistant Examiner*—Harry W Byrne
(74) *Attorney, Agent, or Firm*—Perkins Coie LLP

(57) ABSTRACT

A state storage device for use in an RFID tag includes, in at least one embodiment, a capacitor coupled to a high impedance node. The storage device can be configured to indicate a high or low bit condition. The high impedance node can be designed to dissipate the stored electrical charge at a user-controlled, predefined, or known rate. The state storage device can be configured to store the bit condition for no more than four seconds. In some embodiments, the high impedance node can be formed from an electrically trimmed transistor.

23 Claims, 3 Drawing Sheets

STATE STORAGE WITH DEFINED RETENTION TIME

BACKGROUND

One of the major problems facing radio frequency identification ("RFID") systems today is that of RFID tags not being read, which results in a reduction in tag identification rates. Tags are less likely to be read if a large number of tags is present in a small enclosure. When tags are close to each other, they can shield other tags and mutual coupling between tags can result in tags losing power. Loss of power can result in tags not being identified or taking too long to identify. As a result, some currently available RFID systems have not shown good performance when used with a high density of RFID tags close to each other.

To prevent tags from losing power, persistent state storage bits ("superbits") that store flags can be implemented in tags. Using such state storage can give substantial improvement in RFID throughput, help eliminate missed tags in passive RFID operation, and improve tag recognition. Using known systems, however, a command sent to a tag to reset a persistent state storage bit might not be received and the capacitor may stay charged. If a particular tag is weakly energized (e.g., if the tag is energized only at one frequency out of 30 frequencies in the band), and if the tag's state storage bit is not reset several times because it misses most reset commands, then this tag could be missed by all identification cycles.

Currently known methods of implementing a state storage bit are based on a high impedance node blocking a capacitor so that the leakage through the high impedance determines the maximum time for which the state storage bit can be stored. Since the high impedance depends on parasitics, the state storage time can vary from a few seconds to a few hours, or even days. Currently known state storage devices allow the capacitor to drain current too quickly or allow the capacitor can retain a charge for too long. In known devices, when the power supply is off, the state storage device dissipates its charge by means of an unknown and widely varying leakage current.

DETAILED DESCRIPTION

In a broad sense, systems and methods for controlling the duration for which the tag will retain its charge are disclosed in detail below. These systems and methods can be used with any protocol for passive RFID operation.

The state storage bit is a bit that is stored in a volatile memory cell. It can be used as a flag that can be retained over short periods of time when the tag loses power. In some embodiments, the state storage bit can be a passively stored on a capacitor. When a tag loses power, the capacitor can retain its charge. Thus, when a reader reads the tag again, the reader can recognize the state storage bit condition. Using the information stored in this bit condition or flag condition, the base station or reader can selectively engage the tag in the protocol.

In some embodiments, the state storage bit storage time can be set to a predetermined or otherwise known time selected to avoid missing tags in subsequent interrogation rounds due to a missed command to reset the state storage bit. This known time provides a known upper limit on the storage duration of the state storage bit. As discussed above, a limited retention time helps prevent tags that were already identified from entering the protocol loop again and thereby increases throughput significantly.

Figure 1:
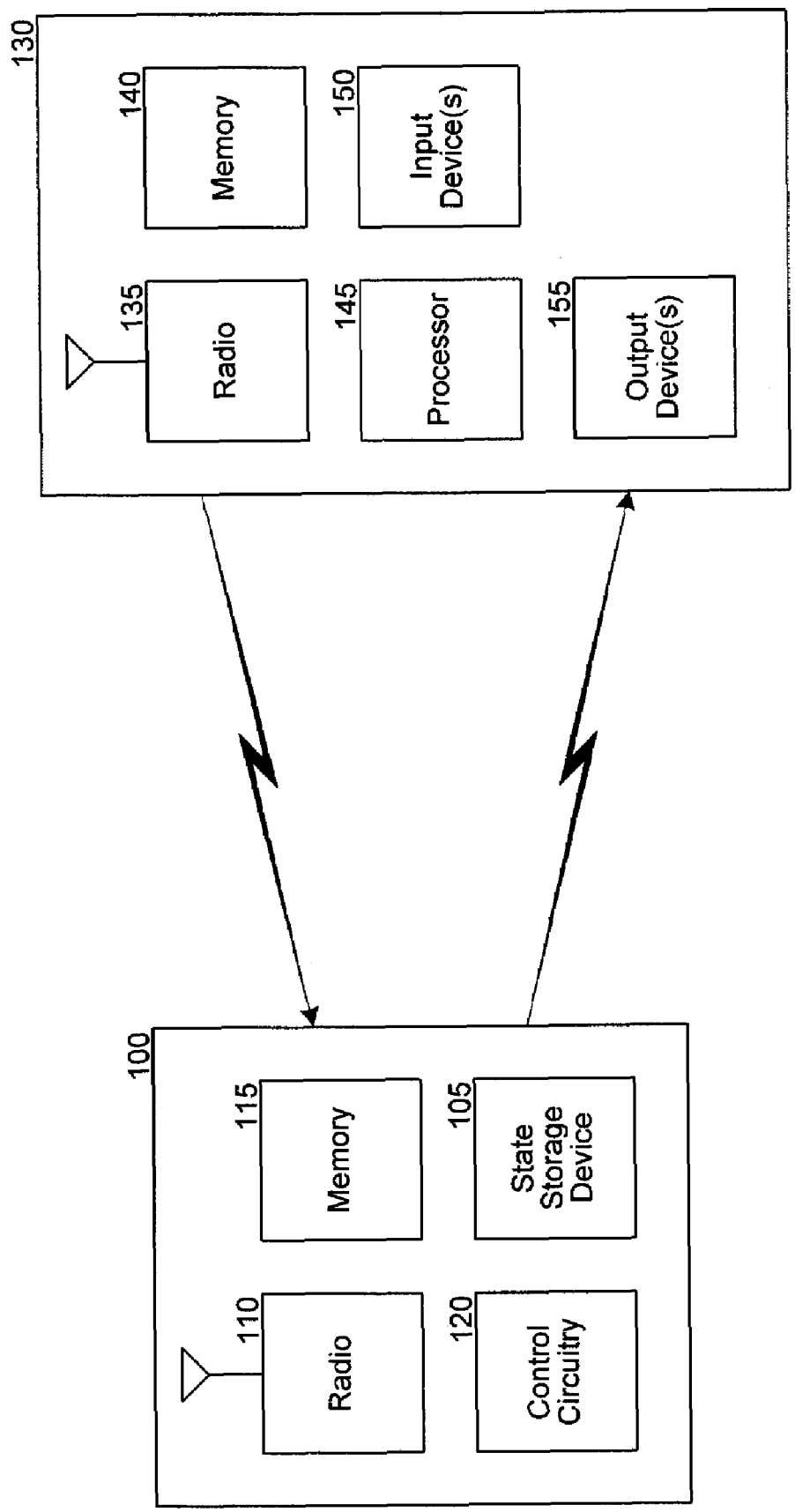
FIG. 1 illustrates an RFID reader and an RFID tag with a state storage bit.

A tag 100 including a state storage device 105 is illustrated in FIG. 1. As shown in FIG. 1, the tag 100 also includes common RFID components, including a radio with antennae 110 or other circuitry for receiving RF energy and reflecting or transmitting wirelessly information stored in a memory 115. Controller circuitry 120 can control aspects of the tag 100 including a state storage device 105, as described below.

An RFID reader 130 can include common components, including a radio 135, memory 140, one or more processors 145, one or more input devices 150, and one or more output devices 155. The memory 140 can store instructions for operating the reader 130, as well as for storing data to be written to, or reading from the tag 100. In some embodiments, the reader 130 can include a microcontroller module and/or a digital signal processor (DSP) module. The microcontroller module can provide control over high level operation of the reader and communicate with an external network and peripheral devices. The DSP module can provide direct control over operations of the radio 135 in response to high level commands provided by the microcontroller module. The radio 135 can provide for RF communications to/from the tag 100.

Figure 2:
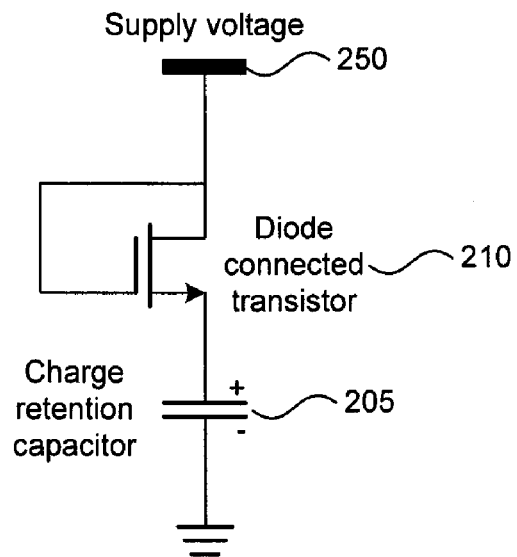
FIG. 2 illustrates a device for storing a state storage bit.

One exemplary embodiment of a state storage device is illustrated in FIG. 2. In this embodiment, the state storage bit can be stored on a capacitor 205 which is coupled to high impedance node 210. When an RFID chip loses power, the high impedance node 210 acts to slow or otherwise control the rate at which the charge on the capacitor 205 is dissipated. In the embodiment illustrated in FIG. 2, the high impedance node 210 is a diode-connected transistor.

With reference to the embodiment illustrated in FIG. 2, the state storage device can use a diode or transistor as high impedance node 210 to control the leakage current from the capacitor 205. As illustrated, the capacitor 205 can be used for bit storage and can be charged through the diode-connected transistor 210. In some embodiments, the capacitor 205 is charged when the tag is fully or nearly fully powered. In some embodiments, the capacitor 205 can be drained at a user-selectable rate so that it is dissipated in a user-defined period. Control circuitry can be used to selectively charge and discharge the capacitor.

In some embodiments, the transistor can be electrically trimmed so that its leakage current when the supply voltage is approximately zero is known. The transistor can be electrically trimmed using known techniques in commercial usage for mainstream CMOS processes. The state storage device disclosed herein is readily applicable to mainstream and inexpensive CMOS processes without the need for any further process steps.

Figure 3:
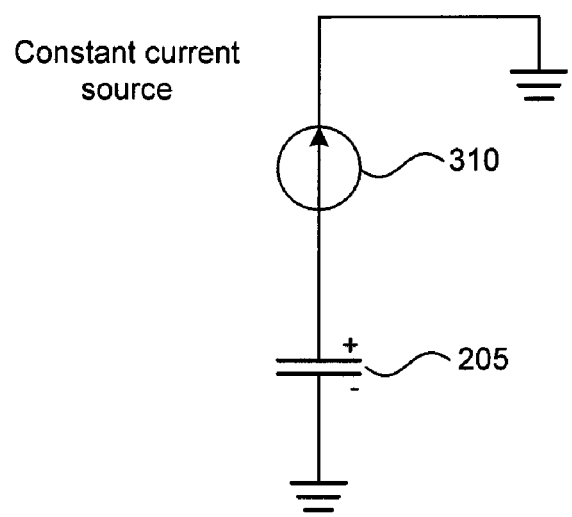
FIG. 3 illustrates a constant current source model for a state storage bit.

The transistor can be electrically trimmed such that the state storage bit will be stored for a predetermined amount of time (or within an acceptable time range). In effect, such an electrically trimmed transistor acts as a constant current source when the supply voltage is off. An electrical model of this embodiment is illustrated in FIG. 3. FIG. 3 illustrates that when capacitor 205 discharges, it appears to the RFID tag as a constant current source 310. With reference to FIG. 2, when the supply voltage 250 is turned off, the transistor 210 can be designed to conduct by means of deep subthreshold regime leakage current.

In some embodiments, the state storage device can be configured so that the reader can reset the state storage bit at the end of one identification cycle. In some readers, the interval between two resets is no more than a few seconds because the reader is continuously performing identifications. It may be desired to reset all tags at the beginning of cycle so that tags that have recently exited the field of another reader with the state storage bit turned on will not be missed in the current cycle or subsequent cycles. In some embodiments, the state storage bit can be configured to last for the time typically required for the reader to run through a predetermined number of frequencies in the band for US operation. In some embodiments, this time is no more than 4 seconds, although multiple sets of tags (with different product numbers) can be manufactured, each with a different time period. Thus, users can purchase and use the tag most suitable for their application.

Figure 4:
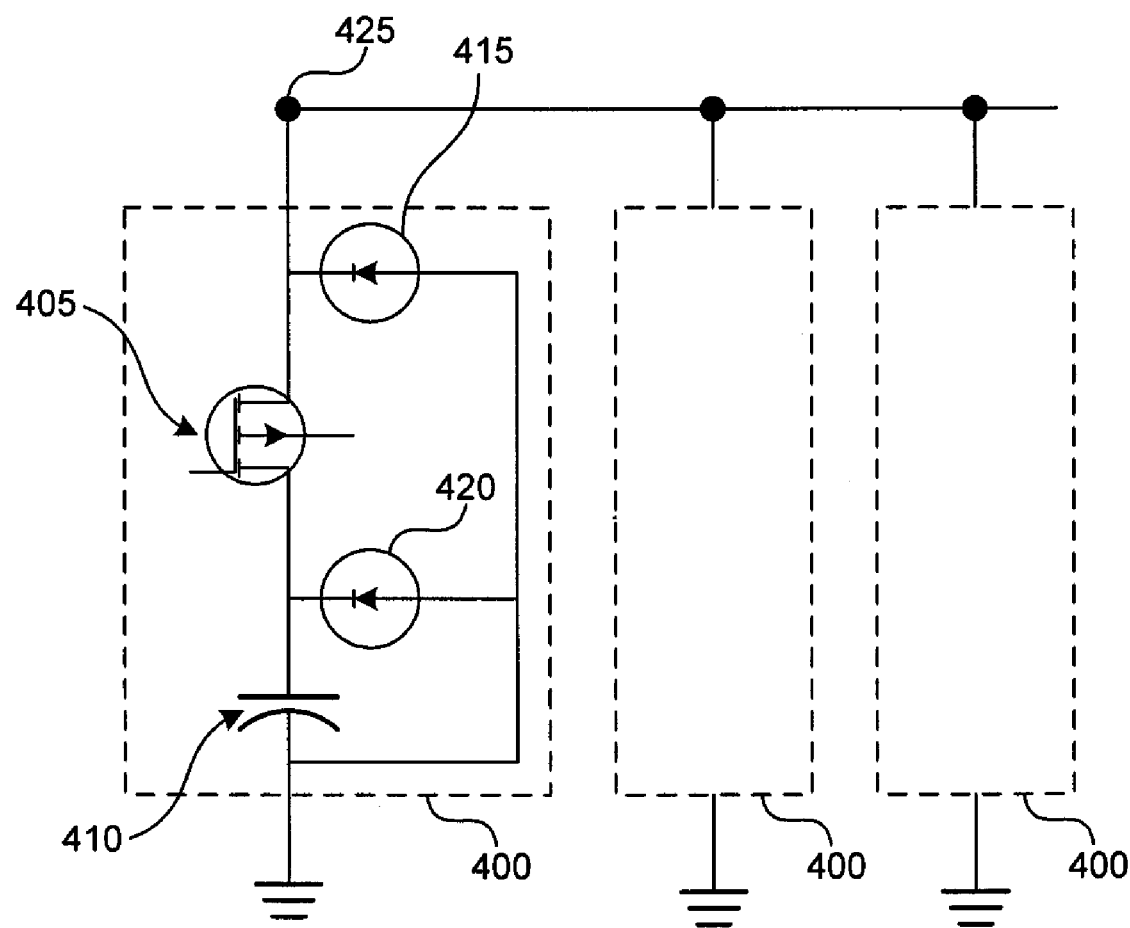
FIG. 4 illustrates a model identifying certain parasitics.

As illustrated in FIG. 4, some embodiments can include a state storage device 400 having a switch 405 to disable or enable state storage capacitor 410. In some embodiments, multiple switches can be used to control multiple capacitors that form a bank of state storage capacitors (shown as multiple, optional devices 400 in FIG. 4). One or more diode connected transistors or other high impedance devices for controlling current leakage can be coupled to node 425. FIG. 4 also illustrates certain parasitics 415 and 420. Parasitic reverse biased diodes 415 and 420 can result from certain methods of fabricating transistors on a semiconductor wafer. These diodes 415 and 420 can determine, to some extent, the leakage from the capacitor. Some embodiments can include transistors that are laid out to account for one or more of parasitics 415 and 420.

In some embodiments, other devices can be used as state storage cells or high impedance nodes. As non-limiting examples, the node can include one or more of a bleeding resistor, a zero bias transistor calibrated for predetermined leakage rates, two or more capacitors in parallel to be switched on and off, or a diode between an upper terminal of the capacitor and ground. In some embodiments, the high impedance node can include several capacitors controlled by a microcontroller (e.g., as shown in FIG. 4). For example, code in NVRAM can include two bits: the first bit for controlling the microcontroller to enable only the first capacitor and the second bit of code, selectively switchable by the user, can instruct the microcontroller to enable all capacitors in the node. In some embodiments, the microcontroller can select one of three capacitors by applying a low, medium, or high voltage on controlling transistors.

For example, the memory 115 of the tag 100 may include two bits or portions of code where the first bit instructs the control circuitry 120 to enable only the first capacitor, whereas the second bit of code can enable the second capacitor, and with both bits flipped, both capacitors are enabled. As a result, three different time periods may be provided (where the capacitors each have different values). The reader 130 can provide appropriate instructions to the tag 100, via the control circuitry, to selectively enable one or both of the capacitors and thereby affectively program a desired time period for holding the state on the tag. In other words, with this embodiment, users may, for example, adjust the time period during which the state storage bit is stored on the tag. Alternatively or additionally, the tag may include multiple cells that represent different values, rather than a single value (as is generally described above).

In some embodiments, the state storage device can be used to implement an inventory flag for a session. In these embodiments, the state storage device can be used to implement multiple sessions wherein the sessions and inventoried flags (Select Flags) are configured according to the EPC RFID Class-1 Generation-2 protocol specification. The state storage device can be used to implement a Select Flag which may be asserted or deasserted by a reader. In these embodiments, the state storage device can be used to implement a Select Flag wherein the Select Flag is configured according to the EPC RFID Class-1 Generation-2 protocol specification. The state storage device can be configured to hold a bit value for a length of time within approximately 500 milliseconds to seconds. In some embodiments, the state storage device can be configured to hold a bit value for at least two seconds. Other variations compliant with other protocols are possible.

In some embodiments, the state storage device can be used to retain tag state for at least 300 microseconds according to the ISO/IEC CD 18000-6 protocol specification. In some embodiments, the state storage device can be configured to indicate a Quiet state for at least 2 seconds according to the ISO/IEC CD 18000-6 protocol specification. Other variations compliant with other protocols are possible.

In some embodiments, a tag reader can set or otherwise be aware of the duration of time for which charge is retained by a state storage device on a tag. As a result, a tag is less likely to be missed by the reader due to the tag carrying a residual charge from a previous round of interrogation.

CONCLUSION

Many specific details of certain embodiments of the invention are set forth in the description and in FIGS. 1-4 to provide a thorough understanding of these embodiments. A person skilled in the art, however, will understand that the invention may be practiced without several of these details or additional details can be added to the invention. Well-known structures and functions have not been shown or described in detail to avoid unnecessarily obscuring the description of the embodiments of the invention. As used herein, one or more components "coupled" to each other can be coupled directly (i.e., no other components are between the coupled components) or indirectly (i.e., one or more other components can be placed between the coupled components).

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined or altered to provide further embodiments.

These and other changes can be made to the invention in light of the above Detailed Description. While the above description describes certain embodiments of the invention, and describes the best mode contemplated, no matter how detailed the above appears in text, the invention can be practiced in many ways. Details of the system may vary considerably in its implementation details, while still being encompassed by the invention disclosed herein.

The terminology used in the Detailed Description is intended to be interpreted in its broadest reasonable manner, even though it is being used in conjunction with a detailed description of certain specific embodiments of the invention. Certain terms may even be emphasized; however, any terminology intended to be interpreted in any restricted manner will be overtly and specifically defined as such in this Detailed Description section. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

While certain aspects of the invention are presented below in certain claim forms, the inventors contemplate the various aspects of the invention in any number of claim forms. For example, while only one aspect of the invention is recited as a means-plus-function claim under 35 U.S.C sec. 112, other aspects may likewise be embodied as a means-plus-function claim. Accordingly, the inventors reserve the right to add additional claims after filing the application to pursue such additional claim forms for other aspects of the invention.

I claim:

1. A state storage device for an RFID tag, comprising:
    a capacitor for storing charge; and
    a high impedance node coupled to the capacitor, between a voltage source and the capacitor,
    wherein the state storage device is configured to permit the charge stored in the capacitor to be sensed externally from the RFID tag by an RFID reader;
    wherein the high impedance node dissipates the charge stored in the capacitor at a substantially constant rate, and
    wherein the state storage device is manufactured or configured to maintain the charge stored in the capacitor for a predetermined time period.

2. The state storage device of claim 1, wherein the high impedance node comprises an electrically trimmed transistor.

3. The state storage device of claim 1, wherein the high impedance node comprises a diode-connected transistor.

4. The state storage device of claim 1, wherein the state storage device is configured to store a flag condition.

5. The state storage device of claim 1, wherein the state storage device is configured to store an EPC RFID Class-1 Generation-2 select flag asserted by a reader.

6. The state storage device of claim 1, wherein the state storage device is configured to store a bit value for a length of time within approximately 500 milliseconds to 5 seconds.

7. The state storage device of claim 1, wherein the state storage device is configured to store a flag condition for a time period not to exceed a time required for a first interrogation round.

8. The state storage device of claim 1, wherein the state storage device is configured to store a flag condition for time period not to exceed four seconds.

9. The state storage device of claim 1 wherein the state storage device is configured to store a bit condition for a user-defined time period controlled by current dissipation at a user-selectable rate.

10. The state storage device of claim 9, wherein the user-defined time period is communicated to the state storage device by an RFID reader.

11. The state storage device of claim 1, wherein the device further comprises:
    a controller for controlling a dissipation rate of the charge stored in the capacitor; and
    a receiver for receiving a command to discharge the state-storage capacitor at an end of an identification cycle.

12. The state storage device of claim 1, wherein the device further comprises:
    multiple capacitors; and
    multiple switches coupled to each of the multiple capacitors for selecting one or more of the multiple capacitors.

13. A device for use in an RFID tag to store a state, wherein the state may be read by an RFID reader, the device, comprising:
    a capacitor for storing charge, wherein the charge represents a state;
    a diode-connected transistor connected to the capacitor;
    a voltage node for coupling to a voltage source, wherein the voltage node is coupled to the diode-connected transistor;
    wherein leakage current of the diode-connected transistor determines a rate at which the charge stored in the capacitor dissipates;
    wherein a characteristic of the capacitor, the diode-connected transistor, or both, is selected to maintain the charge in the capacitor for a selected time period; and,
    wherein an RFID reader, within the selected time period, can read the charge to determine the state of the RFID tag.

14. The device of claim 13, wherein, the leakage current of the diode-connected transistor conducts in deep subthreshold regime when the voltage source is off.

15. The device of claim 13, wherein the selected time period for which the state is stored is user-defined.

16. A device for temporarily storing a state in a portable data storage circuit, the device comprising:
    a capacitor for storing charge;
    a high impedance element coupled with the capacitor, between the capacitor and a voltage source;
    wherein the device is configured to permit the charge stored in the capacitor to be sensed via a reader wirelessly communicating with the portable data storage circuit;
    wherein the high impedance element controls a rate at which the charge stored in the capacitor dissipates;

wherein a characteristic of the capacitor, the high impedance element, or both, is selected to maintain the charge in the capacitor for a selected time period; and wherein the reader is able to determine the state of the portable data storage circuit when wirelessly communicating with the portable data storage circuit during the selected time period.

17. The device of claim 16, wherein, the portable data storage unit includes an RFID tag;

wherein, the RFID tag further includes a radio circuit.

18. The device of claim 16, further comprising a switch to disable or enable the capacitor.

19. The device of claim 16, wherein, the RFID tag further includes a controller circuitry to selectively charge or discharge the capacitor.

20. The device of claim 16, wherein, the rate at which the charge dissipates is user-selectable;

wherein, the user-selectable time period is communicated to the device by an RFID reader.

21. The device of claim 16, wherein, the high impedance element includes, one or more of, a bleeding resistor and a diode.

22. The device of claim 16, wherein, the high impedance element includes a transistor that is electrically trimmed and functions as a constant current source when the voltage source is off.

23. The device of claim 16, wherein, the high impedance element includes two or more capacitors in parallel; and, wherein, the two or more capacitors are controlled by a microcontroller.

* * * * *